United States Patent
Liu et al.

(10) Patent No.: US 10,388,761 B2
(45) Date of Patent: Aug. 20, 2019

(54) 3-D FLASH MEMORY DEVICE AND MANUFACTURE THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Panpan Liu, Shanghai (CN); Haiyang Zhang, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 15/919,375

(22) Filed: Mar. 13, 2018

(65) Prior Publication Data
US 2018/0261687 A1    Sep. 13, 2018

(30) Foreign Application Priority Data
Mar. 13, 2017    (CN) .......................... 2017 1 0144096

(51) Int. Cl.
*H01L 29/66*    (2006.01)
*H01L 21/822*    (2006.01)
(Continued)

(52) U.S. Cl.
CPC .... *H01L 29/66787* (2013.01); *G11C 16/0483* (2013.01); *H01L 21/02244* (2013.01);
(Continued)

(58) Field of Classification Search
CPC ......... H01L 29/66787; H01L 21/02244; H01L 21/8221; H01L 27/11587; H01L 27/1158;
(Continued)

(56) References Cited

U.S. PATENT DOCUMENTS 5,198,379 A * 3/1993 Adan ................ H01L 29/66477
257/E21.409
7,897,463 B2 * 3/2011 Yun ..................... H01L 29/0653
438/154

(Continued)

FOREIGN PATENT DOCUMENTS

WO    WO-2011114503 A1 *    9/2011    ........ H01L 27/11568

*Primary Examiner* — Victoria K. Hall
(74) *Attorney, Agent, or Firm* — Innovation Counsel LLP (57) ABSTRACT

A 3-D flash memory device and its manufacturing method, relating to semiconductor technology. The manufacturing method comprises: providing a semiconductor structure comprising a substrate, a first insulation layer on the substrate, a fin structure comprising a first gate layer and a second insulation layer stacked alternately over each other on the first insulation layer, a third insulation layer on two sides of the fin structure, with the first gate layer being surrounded by the first, the second and the third insulation layers, and at least one channel layer covering the fin structure and the third insulation layer; and forming a groove by etching the channel layer, the second insulation layer and the first gate layer along an extension direction of the fin structure. This inventive concept improves the storage density of a 3-D flash memory device.

17 Claims, 10 Drawing Sheets

(51) Int. Cl.
*H01L 21/02* (2006.01)
*H01L 27/06* (2006.01)
*H01L 27/12* (2006.01)
*H01L 27/11524* (2017.01)
*G11C 16/04* (2006.01)
*H01L 27/1157* (2017.01)
*H01L 27/11582* (2017.01)

(52) U.S. Cl.
CPC ...... *H01L 21/8221* (2013.01); *H01L 27/0688* (2013.01); *H01L 27/1157* (2013.01); *H01L 27/11524* (2013.01); *H01L 27/11582* (2013.01); *H01L 27/1211* (2013.01)

(58) Field of Classification Search
CPC .......... H01L 27/11582; H01L 27/0688; H01L 27/11524; H01L 27/1157; H01L 27/1211; H01L 27/11575; H01L 27/11531; H01L 27/11529; H01L 27/11551; H01L 27/11553; H01L 27/11556; H01L 29/792; H01L 29/7926; G11C 16/0483
See application file for complete search history.

(56) References Cited

U.S. PATENT DOCUMENTS

| | | | | |
|---|---|---|---|---|
| 8,164,134 B2* | 4/2012 | Kim | ................... | H01L 29/7926 257/314 |
| 8,183,624 B2* | 5/2012 | Mizukami | ............. | H01L 27/105 257/326 |
| 8,664,707 B2* | 3/2014 | Kim | .................... | H01L 29/7926 257/314 |
| 9,922,991 B2* | 3/2018 | Kamigaki | ......... | H01L 27/11582 |
| 2006/0049429 A1* | 3/2006 | Kim | .................. | H01L 29/42384 257/213 |
| 2006/0091556 A1* | 5/2006 | Shigeoka | ........... | H01L 21/8221 257/773 |
| 2008/0253183 A1* | 10/2008 | Mizukami | ............. | H01L 27/105 365/185.05 |
| 2009/0001419 A1* | 1/2009 | Han | ....................... | B82Y 10/00 257/190 |
| 2010/0308391 A1* | 12/2010 | Kim | .................. | H01L 27/11578 257/314 |
| 2012/0273872 A1* | 11/2012 | Lim | .................... | H01L 27/0688 257/329 |
| 2013/0015520 A1* | 1/2013 | Shosuke | ............ | H01L 27/11568 257/324 |
| 2015/0270279 A1* | 9/2015 | Arigane | ............ | H01L 27/11568 257/324 |
| 2016/0064088 A1* | 3/2016 | Shiga | ...................... | G11C 16/14 365/185.17 |
| 2016/0267981 A1* | 9/2016 | Hioka | ................ | G11C 16/0483 |
| 2017/0162583 A1* | 6/2017 | Lee | .................. | H01L 27/1104 |
| 2017/0194213 A1* | 7/2017 | Ching | ............ | H01L 21/823821 |
| 2017/0194480 A1* | 7/2017 | Chen | .................. | H01L 29/7851 |
| 2018/0356660 A1* | 12/2018 | Tomida | ............. | H01L 21/76829 |

* cited by examiner

3-D FLASH MEMORY DEVICE AND MANUFACTURE THEREOF

CROSS-REFERENCE TO RELATED APPLICATION

This application claims priority to and benefit of Chinese Patent Application No. 201710144096.2 filed on Mar. 13, 2017, which is incorporated herein by reference in its entirety.

BACKGROUND

(a) Field of the Invention

This inventive concept relates generally to semiconductor technology, and more specifically, to a 3-D flash memory and particularly a Vertical Stacked Array Transistor (VSAT), and its manufacturing method.

(b) Description of the Related Art

Various 3-D NAND flash memory techniques dramatically reduce the size of a NAND flash memory without compromising its capacity, and therefore have a promising prospect in the industry. Compared to conventional 2-D NAND flash memories, a 3-D flash memory can increase its storage density by stacking multiple layers in the memory, and therefore is less constrained by the limitations on lithography resolution or device size. Based on the direction of the current, 3-D NAND flash memories can be categorized into vertical channel NAND flash memories and vertical gate NAND flash memories. Currently, 3-D NAND flash memories include Pipe-shaped Bit Cost Scalable (P-BiCS) flash memory, Terabit Cell Array Transistor (TCAT), and Vertical Stacked Array Transistor (VSAT).

Conventional VSATs have several limitations. First, conventional VSATs have a relatively low storage density and therefore may not meet some requirements that demand high storage density. Second, conventional VSATs are manufactured by a Gate-First process that forbids metal gate, and thus have a high threshold voltage. Third, the channel currents in conventional VSATs flow along an upward-then-downward direction (resembling a reversed "U" shape), which limits the expandability of the device.

SUMMARY

The inventors of this inventive concept investigated the issues in conventional techniques and proposed an innovative solution that remedies at least one issue of the conventional techniques.

This inventive concept first presents a 3-D flash memory device manufacturing method, comprising:
  providing a semiconductor structure, wherein the semiconductor structure comprises:
    a substrate,
    a first insulation layer on the substrate,
    a fin structure comprising a first gate layer and a second insulation layer stacked alternately over each other on the first insulation layer,
    a third insulation layer on two sides of the fin structure, with the first gate layer being surrounded by the first, the second and the third insulation layers, and
    at least one channel layer covering the fin structure and the third insulation layer; and
  forming a groove by etching the channel layer, the second insulation layer, and the first gate layer along an extension direction of the fin structure, wherein the channel layer, the second insulation layer, and the first gate layer are each separated by the groove into two parts facing each other.

Additionally, in the aforementioned method, when forming the groove, the first gate layer may be exposed at two inner sides of the groove, and the aforementioned method may further comprise:
  forming a plurality of cavities by removing the first gate layer; and
  forming a second gate layer in each of the cavities.

Additionally, in the aforementioned method, the second gate layer may be made of a metallic material.

Additionally, in the aforementioned method, the second gate layer may be made of tungsten.

Additionally, in the aforementioned method, forming a second gate layer in each of the cavities may comprise:
  depositing a second gate material layer in the groove filling the plurality of cavities; and
  etching the second gate material layer to remove the second gate material layer outside the plurality of the cavities, so that each cavity has a portion of second gate material layer, and the second gate material layer in different cavities do not contact each other.

Additionally, in the aforementioned method, when providing the semiconductor structure, recesses may be formed on two sides of the fin structure on the first insulation layer, and the aforementioned method may further comprise:
  before forming the groove, forming a sacrificial layer covering the channel layer and filling the recesses; and
  conducting a planarization process on the sacrificial layer to expose an upper surface of the channel layer,
and the aforementioned method may further comprise:
after the second gate layer is formed, removing the sacrificial layer.

Additionally, in the aforementioned method, the sacrificial layer may be made of Nitrogen-Free Carbon (NFC).

Additionally, in the aforementioned method, the first gate layer may be made of polysilicon, and may be etched by a wet etching process.

Additionally, in the aforementioned method, when providing the semiconductor structure, the fin structure may comprise a plurality of the first gate layers and a plurality of the second insulation layers stacked alternately over each other, with one of the first gate layers at the bottom of the fin structure and one of the second insulation layers at the top of the fin structure,
and the channel layer may cover the third insulation layer and the second insulation layer at the top of the fin structure.

Additionally, in the aforementioned method, the channel layer may be made of polysilicon, the first insulation layer may be made of silicon dioxide, and the second insulation layer and the third insulation layer may both be made of silicon nitride.

Additionally, in the aforementioned method, providing the semiconductor structure may comprise:
  providing a substrate structure comprising the substrate and the first insulation layer on the substrate;
  forming a multi-layer structure on the first insulation layer, wherein the multi-layer structure comprises a plurality of the first gate layers and a plurality of the second insulation layers stacked alternately over each other, with one of the first gate layers at the bottom of the multi-layer structure and one of the second insulation layers at the top of the multi-layer structure;

forming the fin structure by etching the multi-layer structure;

forming recesses on two sides of the fin structure exposing the first insulation layer;

forming a third insulation layer on two sides of the fin structure;

forming a channel material layer covering the fin structure, the third insulation layer, and the exposed first insulation layer; and forming at least one channel layer by etching the channel material layer.

This inventive concept further presents a 3-D flash memory device, comprising:

a substrate;

a first insulation on the substrate;

a fin structure comprising a gate layer and a second insulation layer stacked alternately over each other on the first insulation layer;

a third insulation layer on two sides of the fin structure, with the gate layer being surrounded by the first, the second and the third insulation layers;

at least one channel layer covering the fin structure and the third insulation layer; and a groove along an extension direction of the fin structure, wherein the channel layer, the second insulation layer, and the gate layer are each separated by the groove into two parts facing each other.

Additionally, in the aforementioned device, the gate layer may be exposed at two inner sides of the groove.

Additionally, in the aforementioned device, the gate layer may be made of a metallic material.

Additionally, in the aforementioned device, the gate layer may be made of tungsten.

Additionally, in the aforementioned device, the fin structure may comprise:

a plurality of gate layers and a plurality of second insulation layers stacked alternately over each other, with one of the gate layers at the bottom of the fin structure and one of the second insulation layers at the top of the fin structure, and the channel layer covers the third insulation layer and the second insulation layer at the top of the fin structure.

Additionally, in the aforementioned device, the channel layer may be made of polysilicon, the first insulation layer may be made of silicon dioxide, and the second insulation layer and the third insulation layer may both be made of silicon nitride.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

Figure 1:
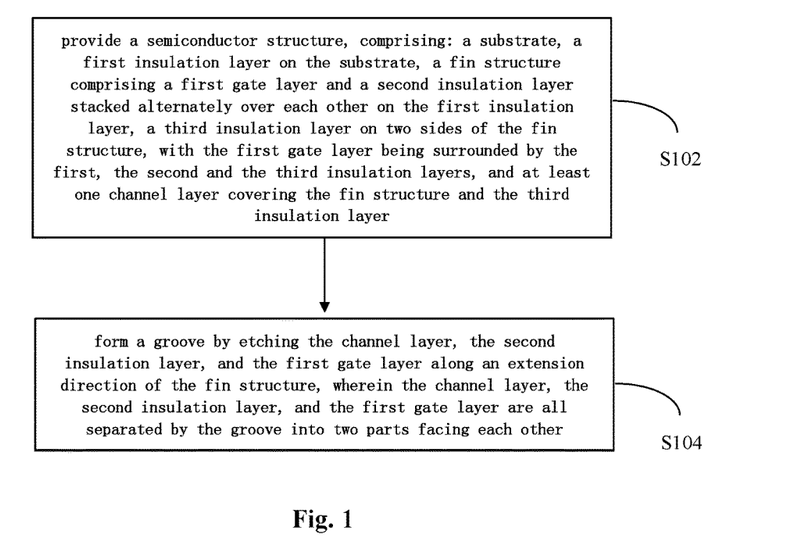
FIG. 1 shows a flowchart illustrating a 3-D flash memory device manufacturing method in accordance with one or more embodiments of this inventive concept.

FIG. 1 shows a flowchart illustrating a 3-D flash memory device manufacturing method in accordance with one or more embodiments of this inventive concept.

In step S102, a semiconductor structure is provided, the semiconductor structure comprises a substrate, a first insulation layer on the substrate, a fin structure comprising a first gate layer and a second insulation layer stacked alternately over each other on the first insulation layer, a third insulation layer on two sides of the fin structure, with the first gate layer being surrounded by the first, the second and the third insulation layers, and at least one channel layer covering the fin structure and the third insulation layer.

Here, "stacked alternately over each other" means two types of layers positioned on top of one another taking turns. For example, "a first gate layer and a second insulation layer stacked alternately over each other" means a second insulation layer is first formed on a first gate layer, then another first gate layer is formed on this second insulation layer, and another second insulation layer is formed on that first gate layer, so on so forth.

In one embodiment, the channel layer may be made of polysilicon, the first insulation layer may be made of silicon dioxide, and the second insulation layer and the third insulation layer may both be made of silicon nitride. In one embodiment, the first gate layer may be made of polysilicon.

In step S104, a groove may be formed by etching the channel layer, the second insulation layer and the first gate layer along an extension direction of the fin structure, wherein the channel layer, the second insulation layer, and the first gate layer are all separated by the groove into two parts facing each other. During this process, the first gate layer is exposed at two inner sides of the groove.

The embodiment described above provides a 3-D flash memory device (such as a VSAT) manufacturing method. In this manufacturing method, the groove formed along the extension direction of the fin structure separates the channel layer, the second insulation layer and the first gate layer into two parts facing each other, and thus increases the storage density and lowers the bit cost of the 3-D flash memory. Additionally, when the channel layer is separated into two parts, the channel current can flow along one direction (either moving forward or backward), and it is not constrained by the reversed "U" shape channel in conventional devices, thus the expandability of the device is increased.

In one embodiment of this inventive concept, the manufacturing method may further comprise forming a plurality of cavities by removing the first gate layer; and forming the second gate layer in each of the cavities. In this embodiment, the gate of the 3-D flash memory device (e.g., a VSAT) is exchangeable. For example, the second gate layer may be made of a metallic material, such as tungsten. Therefore, in this embodiment, the first gate layer of a 3-D flash memory that was made of polysilicon can be replaced by a metallic gate layer, and thus lowers a threshold voltage. Additionally, a metallic gate has lower resistance than a polysilicon gate, and thus it lowers power consumption and improves performance of the device.

In one embodiment, when providing the semiconductor structure, recesses may be formed on two sides of the fin structure on the first insulation layer. The method may further comprise, before forming the groove, forming a sacrificial layer covering the channel layer and filling the recesses, and conducting a planarization process on the sacrificial layer to expose an upper surface of the channel layer. The method may further comprise, after the second gate layer is formed, removing the sacrificial layer. In this embodiment, a sacrificial layer filling the recesses is formed, it facilitates the etching and removing procedures in succeeding stages.

FIGS. 2, 3, 4, 5, and 6 show graphic models illustrating different stages of a 3-D flash memory device manufacturing method in accordance with one or more embodiments of this inventive concept. FIGS. 7, 8, 9, 10, 11, and 12 show schematic sectional views illustrating different stages of a 3-D flash memory device manufacturing method in accordance with one or more embodiments of this inventive concept. The schematic sectional views in FIGS. 7, 8, 9, 10, 11, and 12 are observed along a direction A-A' shown in FIG. 6. A 3-D flash memory device manufacturing method in accordance with one or more embodiments of this inventive concept will be described below in reference to these drawings.

First, a semiconductor structure is provided, the details procedures of this step are described in references to FIGS. 2, 3, 4, 5, and 6.

Figure 2:
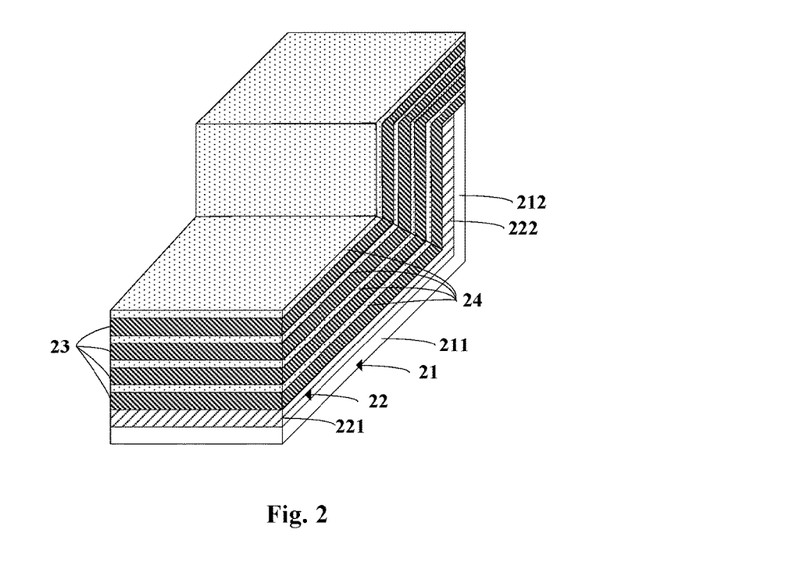
FIGS. 2, 3, 4, 5, and 6 show graphic models illustrating different stages of a 3-D flash memory device manufacturing method in accordance with one or more embodiments of this inventive concept.

Referring to FIG. 2, a substrate structure is provided. The substrate structure may comprise a substrate 21 and a first insulation layer 22 on the substrate. The substrate 21 may be a silicon substrate and the first insulation layer 22 may be made of silicon dioxide. Referring to FIG. 2, the substrate 21 may comprise a horizontally-positioned first substrate component 211 and a second substrate component 212 perpendicular to the first substrate component 211. The first insulation layer 22 is formed on the substrate 21, so it may also comprise a first component 221 on the first substrate component 211 and a second component 222 perpendicular to the first component 221.

Next, referring to FIG. 2, a multi-layer structure is formed on the first insulation layer 22. The multi-layer structure comprises a plurality of first gate layers 23 and a plurality of second insulation layer 24 stacked alternately over each other. The first gate layer 23 may be made of doped polysilicon, and the second insulation layer 24 may be made of silicon nitride. Referring to FIG. 2, one of the first gate layers 23 is at the bottom of the multi-layer structure and on the first insulation layer 22, and one of the second insulation layer 24 is at the top of the multi-layer structure.

Figure 3:
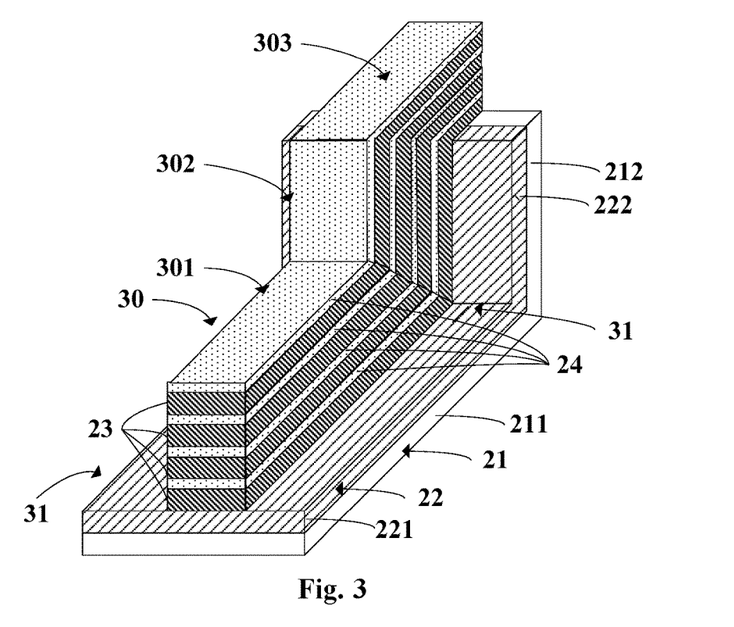

Next, referring to FIG. 3, a fin structure 30 may be formed by etching (e.g., through lithography or a dry etching process) the multi-layer structure. A recess 31 exposing the first insulation layer 22 may be formed on each side of the fin structure 30. Referring to FIG. 3, the fin structure 30 may comprise a first fin component 301 on the first component 221 of the first insulation layer 22, a second fin component 302 perpendicular to the first fin component 301, and a third fin component 303 on the second fin component 302.

Figure 4:
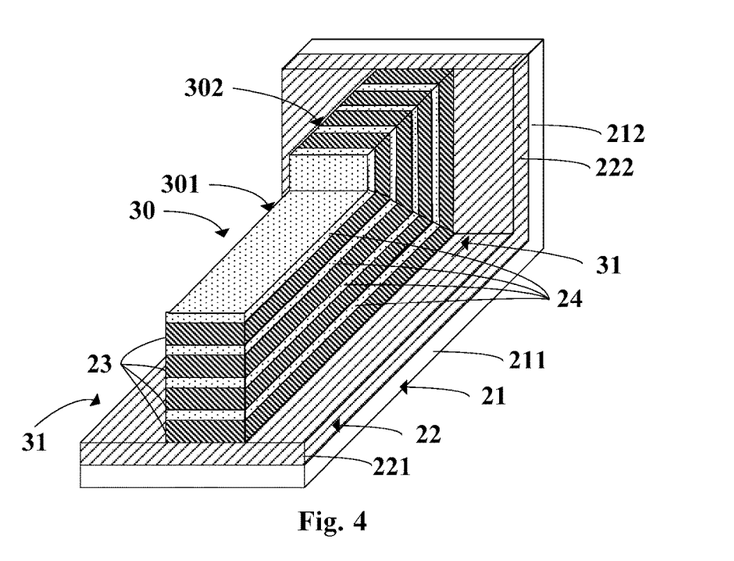

Next, referring to FIG. 4, a planarization process (such as a Chemical Mechanical Planarization (CMP) process) is conducted on the fin structure 30 to remove the third fin component 303 and to expose an upper surface of the first gate layer 23. This process allows a word line being connected to each of the first gate layer in succeeding stages.

Figure 5:
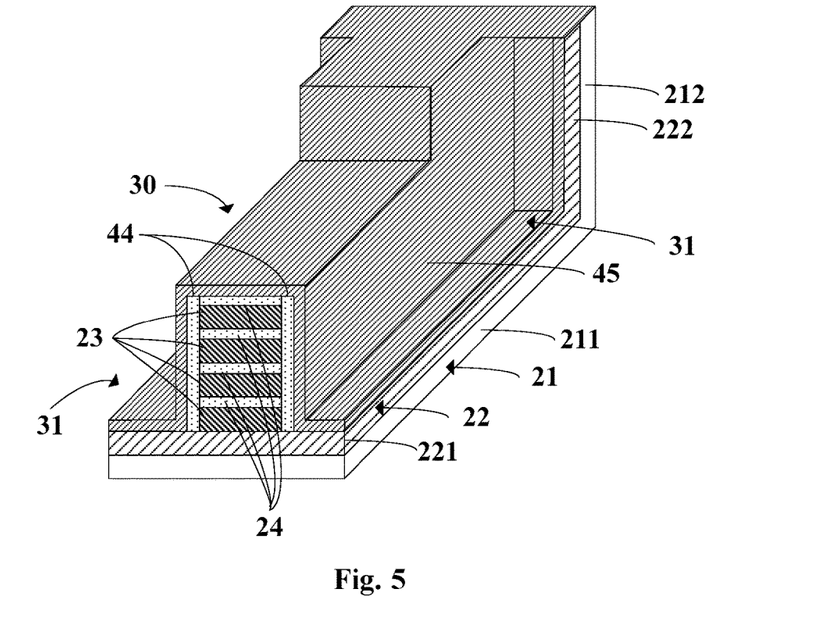

Next, referring to FIG. 5, a third insulation layer 44 is formed on two sides of the fin structure 30, and the third insulation layer 44 may be made of silicon nitride. Optionally, the third insulation layer 44 may also be formed on the exposed portion of the first insulation layer 22 (i.e., at the bottom of the recesses), and on the second insulation layer 24 at the top of fin structure 30. The third insulation layer 44 may work as a gate dielectric layer.

Next, referring to FIG. 5, a channel material layer 45 may be formed covering the fin structure 30, the third insulation layer 44 and the exposed first insulation layer 22. The channel material layer 45 may be made of polysilicon.

Figure 6:
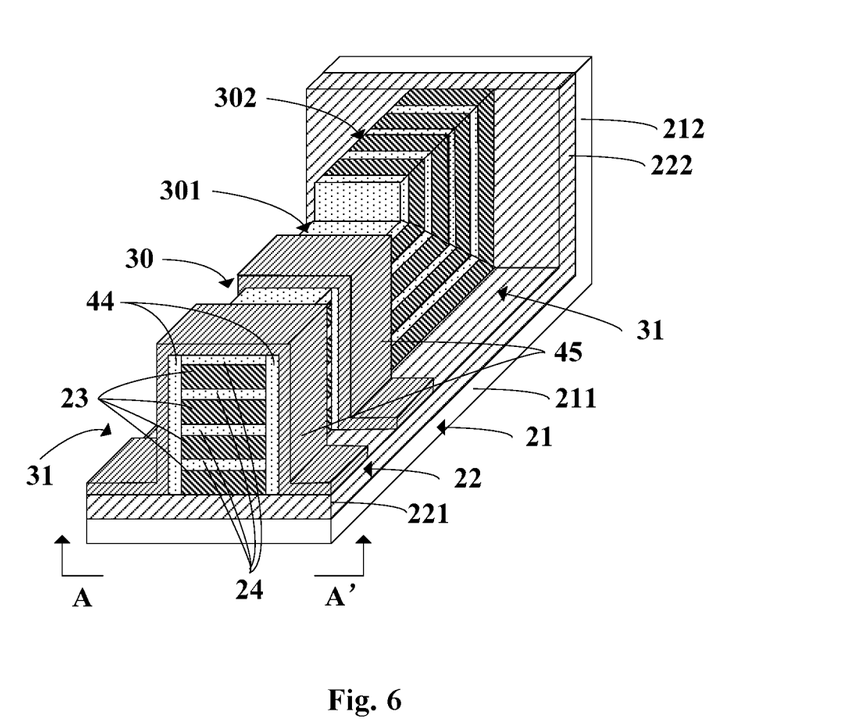

Next, referring to FIG. 6, a channel layer 45 may be formed by etching (e.g., through lithography or an etching process) the channel material layer 45. Only two channel layers 45 are shown in FIG. 6, but a person of ordinarily skills in the art in this field would understand that the number of channel layer in this inventive concept is not limited to two, for example, there could be three or four channel layers.

This forms a semiconductor structure in accordance with one embodiment of this inventive concept.

Referring to FIG. 6, this semiconductor structure may further comprise a substrate 21 and a first insulation layer 22 on the substrate 21. It may further comprise a fin structure 30 comprising a plurality of first gate layers 23 and a plurality of second insulation layer 24 stacked alternately over each other on the first insulation layer 22. The semiconductor structure may further comprise a third insulation layer 44 on two sides of the fin structure 30, with the first gate layer 23 being surrounded by the first insulation layer 22, the second insulation layer 24 and the third insulation layer 44. The semiconductor structure may further comprise at least one channel layer 45 covering the fin structure 30 and the third insulation layer 44. Each channel layer 45 and the fin structure underneath the channel layer 45 may correspond to one flash memory unit.

Referring to FIG. 6, in one embodiment, the fin structure 30 may comprise a plurality of first gate layers 23 and a plurality of second insulation layers 24 stacked alternately over each other, with one of the first gate layers 23 at the bottom of the fin structure 30 and one of the second insulation layers 24 at the top of the fin structure 30, and the channel layer 45 covers the third insulation layer 44 and the second insulation layer 24 at the top of the fin structure 30. In some embodiments, the second insulation layer 24 at the top of the fin structure 30 may be covered by the third insulation layer 44, in that case, the channel layer 45 may cover the third insulation layer 44 covering the top of the fin structure 30, and does not directly cover the second insulation layer 24 at the top of the fin structure 30.

Figure 7:
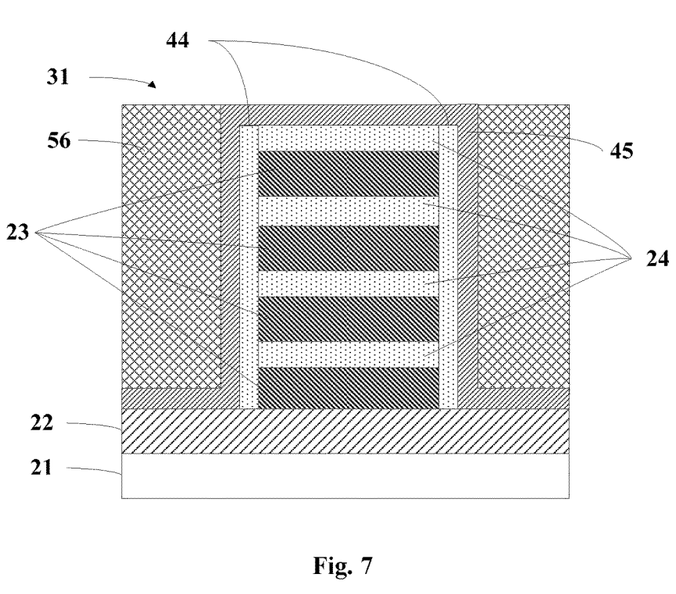
FIGS. 7, 8, 9, 10, 11, and 12 show schematic sectional views illustrating different stages of a 3-D flash memory device manufacturing method in accordance with one or more embodiments of this inventive concept.

Next, referring to FIG. 7, a sacrificial layer 56 may be deposited filling the recesses 31 and covering the channel layer 45, then a planarization process (such as a Chemical Mechanical Planarization (CMP) process) may be conducted on the sacrificial layer 56 to expose an upper surface of the channel layer 45. For example, the sacrificial layer 56 may be made of Nitrogen-Free Carbon (NFC) or other sacrificial materials.

Figure 8:
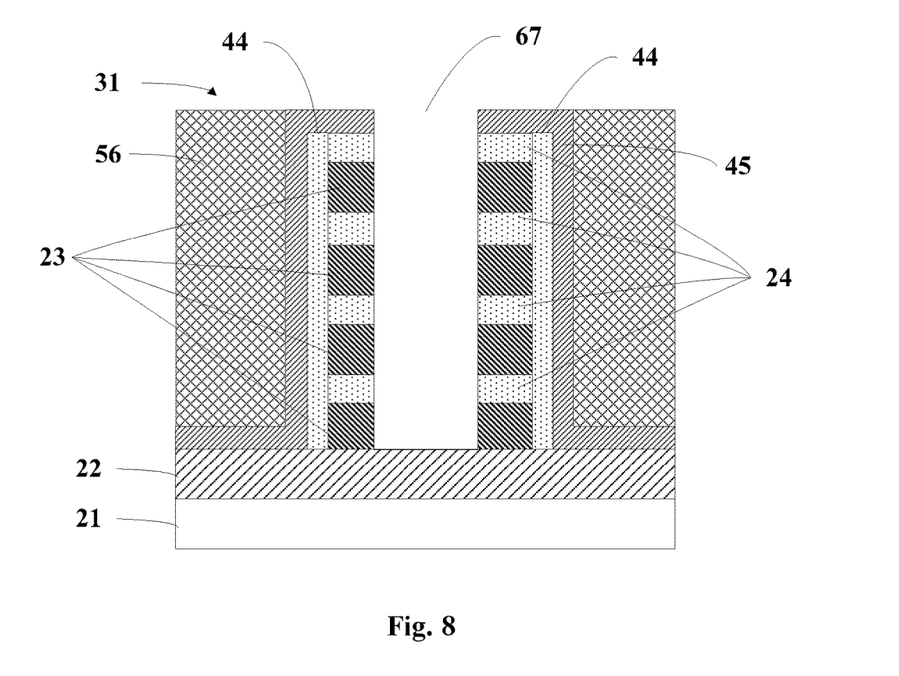

Next, referring to FIG. 8, a groove 67 is formed by etching the channel layer 45, the second insulation layers 24 and the first gate layers 23 along an extension direction of the fin structure 30. The channel layer 45, the second insulation layers 24 and the first gate layers 23 are all separated by the groove 67 into two parts facing each other, and the first gate layers 23 are exposed at the inner sides of the groove 67. The groove 67 may be formed by using Word Line Cut (WLC) to etch the channel layer 45, the second insulation layer 24 and the first gate layer 23.

Figure 9:
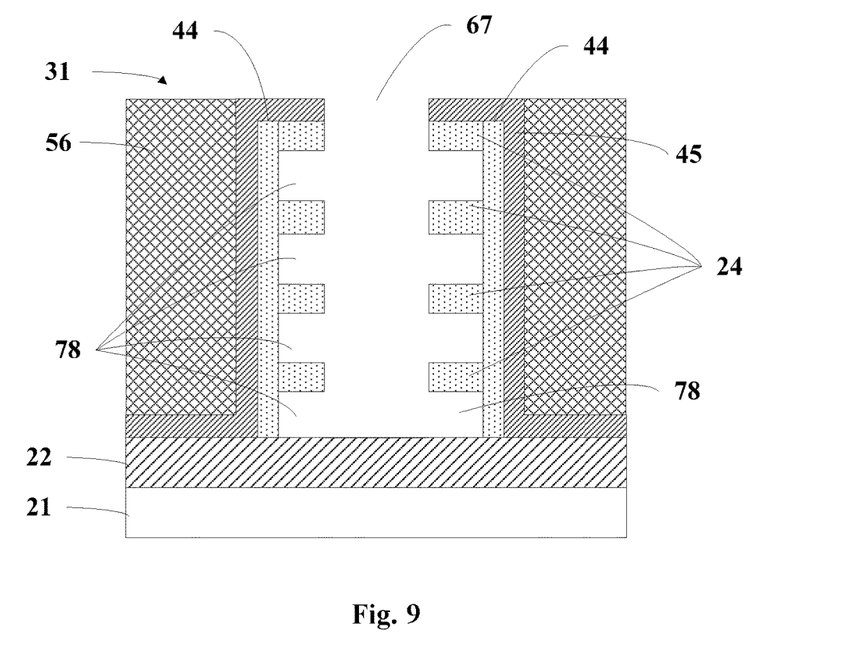

Next, referring to FIG. 9, a plurality of cavities 78 may be formed by removing the first gate layers 23. The first gate layers 23 may be removed by a wet etching process.

Next, a second gate layer 80 is formed in each of the cavities 78, and the second gate layer 80 may be made of a metallic material such as tungsten.

Figure 10:
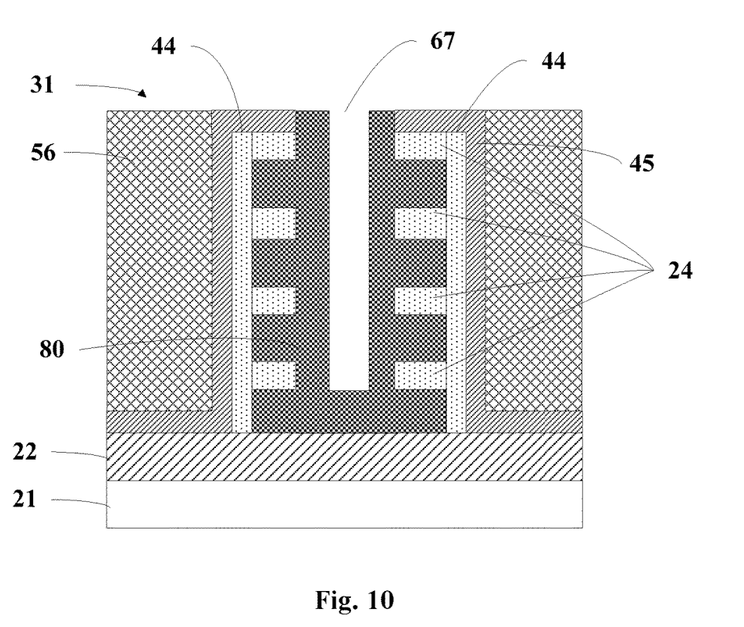
Figure 11:
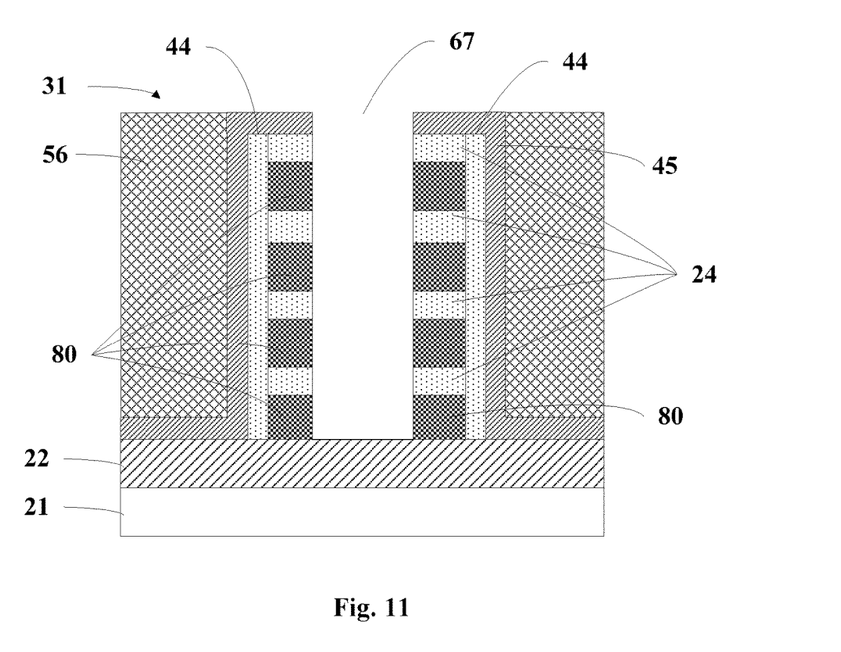

Referring to FIGS. 10 and 11, optionally, forming a second gate layer 80 in each of the cavities 78 may comprise depositing a second gate material layer 80 in the groove 67 filling each of the cavities 78, and conducting an etching process on the second gate material layer 80 to remove the second gate material layer 80 outside the cavities 78, so that each cavity 78 has a portion of the second gate material layer 80, and the second gate material layer 80 in each cavity does not contact each other. Thus, the second gate layer 80 in each of the cavities 78 is formed.

Figure 12:
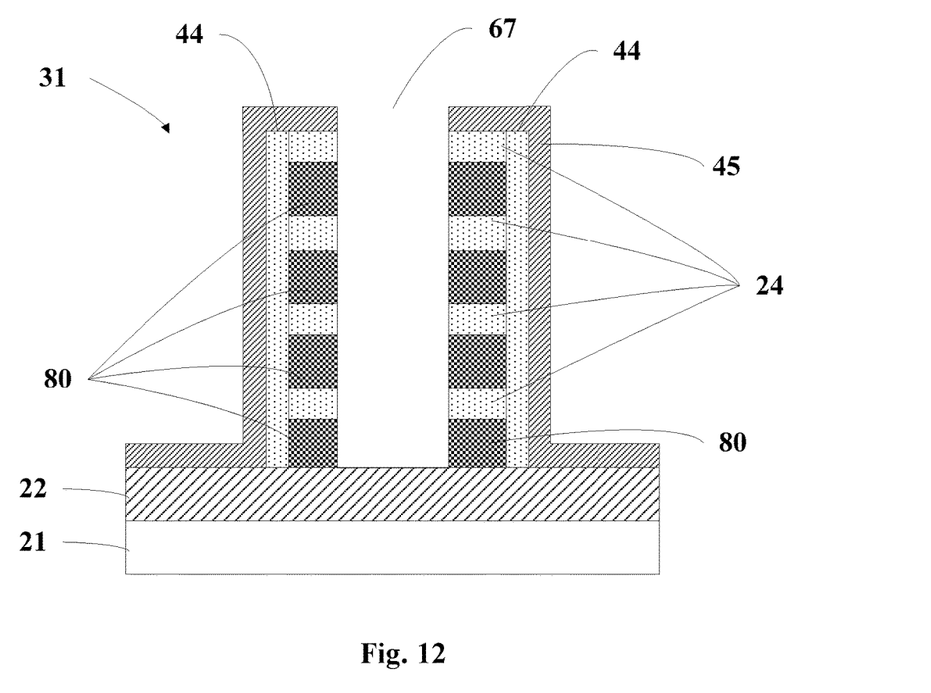

Next, referring to FIG. 12, the sacrificial layer 56 is removed by an ashing process.

This concludes the description of a 3-D flash memory device manufacturing method in accordance with one or more embodiments of this inventive concept. In this manufacturing method, one flash memory unit in conventional methods is divided into two units, that increases the storage density and lowers the bit cost. When the channel layer is separated into two parts, the channel current can flow along one direction (either moving forward or backward), and is not constrained by the reversed "U" shape channel in conventional devices, this increases the expandability of the device.

Additionally, in this manufacturing method, a polysilicon gate in conventional methods is replaced by a metal gate layer (the first gate layer), which lowers the threshold voltage, and the metal gate layer also reduces the channel resistance and power consumption, and improves the performance of the device.

This inventive concept further presents a 3-D flash memory device. Referring to FIG. 12, this 3-D flash memory device may comprise a substrate 21 and a first insulation layer 22 on the substrate 21. The substrate 21 may be a silicon substrate, the first insulation layer 22 may be made of silicon dioxide.

Referring to FIG. 12, the 3-D flash memory device may further comprise a fin structure comprising a gate layer 80 and a second insulation layer 24 stacked alternately over each other on the first insulation layer 22. In one embodiment, the gate layer 80 may be made of a metallic material such as tungsten. The second insulation layer 24 may be made of silicon nitride.

Referring to FIG. 12, in one embodiment, the fin structure may comprise a plurality of the gate layers 80 and a plurality second insulation layers 24 stacked alternately over each other, with one of the gate layers 80 at the bottom of the fin structure (on the first insulation layer 22) and one of the second insulation layers 24 at the top of the fin structure.

Referring to FIG. 12, the 3-D flash memory device may further comprise: a third insulation layer 44 on two sides of the fin structure, with the gate layer 80 being surrounded by the first insulation layer 22, the second insulation layer 24 and the third insulation layer 44. The third insulation layer 44 may be made of silicon nitride.

Referring to FIG. 12, the 3-D flash memory device may further comprise at least one channel layer 45 covering the fin structure and the third insulation layer 44. For example, the channel layer 45 covers the third insulation layer 44 and the second insulation layer 24 at the top of the fin structure. The channel layer 45 may be made of polysilicon.

Referring to FIG. 12, the 3-D flash memory device may further comprise a groove 67 along an extension direction of the fin structure, and the channel layer 45, the second insulation layer 24, and the gate layer 80 are all separated by the groove 67 into two parts facing each other. The gate layer 80 is exposed at the inner sides of the groove 67.

The 3-D flash memory device of this inventive concept may be used as a VSAT. Compared to existing VSAT devices, the 3-D flash memory device of this inventive concept has a higher storage density and lower bit cost. Additionally, when the channel layer is separated into two parts, the channel current can flow along one direction (either moving forward or backward), and is not constrained by the reversed "U" shape channel in conventional devices, this increases the expandability of the device. In this inventive concept, the polysilicon gate in conventional methods is replaced by a metal gate layer, which lowers the threshold voltage, the metal gate layer also reduces the channel resistance and power consumption, and improves the performance of the device.

This concludes the description of a 3-D flash memory device and its manufacturing method in accordance with one or more embodiments of this inventive concept. For purposes of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A 3-D flash memory device manufacturing method, comprising:
   providing a semiconductor structure, wherein the semiconductor structure comprises:
      a substrate,
      a first insulation layer on the substrate,
      a fin structure comprising a first gate layer and a second insulation layer stacked alternately over each other on the first insulation layer,
      a third insulation layer on two sides of the fin structure, with the first gate layer being surrounded by the first, the second and the third insulation layers, and
      at least one channel layer covering the fin structure and the third insulation layer; and
   forming a groove by etching the channel layer, the second insulation layer, and the first gate layer along an extension direction of the fin structure, wherein the channel layer, the second insulation layer, and the first gate layer are each separated by the groove into two parts facing each other.

2. The method of claim 1, wherein when forming the groove, the first gate layer is exposed at two inner sides of the groove, and wherein the method of claim 1 further comprises:
   forming a plurality of cavities by removing the first gate layer; and
   forming a second gate layer in each of the cavities.

3. The method of claim 2, wherein the second gate layer is made of a metallic material.

4. The method of claim 3, wherein the second gate layer is made of tungsten.

5. The method of claim 2, wherein forming a second gate layer in each of the cavities comprises:
   depositing a second gate material layer in the groove filling the plurality of cavities; and
   etching the second gate material layer to remove the second gate material layer outside the plurality of the cavities, so that each cavity has a portion of second gate material layer, and the second gate material layer in different cavities do not contact each other.

6. The method of claim 2,
   wherein when providing the semiconductor structure, recesses are formed on two sides of the fin structure on the first insulation layer,
   wherein the method of claim 2 further comprises:
      before forming the groove, forming a sacrificial layer covering the channel layer and filling the recesses; and
      conducting a planarization process on the sacrificial layer to expose an upper surface of the channel layer, and wherein the method of claim 2 further comprises: after the second gate layer is formed, removing the sacrificial layer.

7. The method of claim 6, wherein the sacrificial layer is made of Nitrogen-Free Carbon (NFC).

8. The method of claim 2, wherein the first gate layer is made of polysilicon, and is etched by a wet etching process.

9. The method of claim 1,
wherein when providing the semiconductor structure, the fin structure comprises a plurality of the first gate layers and a plurality of the second insulation layers stacked alternately over each other, with one of the first gate layers at the bottom of the fin structure and one of the second insulation layers at the top of the fin structure,
and wherein the channel layer covers the third insulation layer and the second insulation layer at the top of the fin structure.

10. The method of claim 1, wherein the channel layer is made of polysilicon, the first insulation layer is made of silicon dioxide, and the second insulation layer and the third insulation layer are both made of silicon nitride.

11. The method of claim 1, wherein providing the semiconductor structure comprises:
providing a substrate structure comprising the substrate and the first insulation layer on the substrate;
forming a multi-layer structure on the first insulation layer, wherein the multi-layer structure comprises a plurality of the first gate layers and a plurality of the second insulation layers stacked alternately over each other, with one of the first gate layers at the bottom of the multi-layer structure and one of the second insulation layers at the top of the multi-layer structure;
forming the fin structure by etching the multi-layer structure;
forming recesses on two sides of the fin structure exposing the first insulation layer;
forming the third insulation layer on two sides of the fin structure;
forming a channel material layer covering the fin structure, the third insulation layer, and the exposed first insulation layer; and
forming the at least one channel layer by etching the channel material layer.

12. A 3-D flash memory device, comprising:
a substrate;
a first insulation layer on the substrate;
a fin structure comprising a gate layer and a second insulation layer stacked over each other on the first insulation layer;
a third insulation layer on two sides of the fin structure, with the gate layer being positioned between the first insulation layer and the second insulation layer and positioned between two portions of the third insulation layer;
at least one channel layer covering the fin structure and the third insulation layer; and
a groove extending along an extension direction of the fin structure, positioned between two parts of the channel layer, positioned between two parts of the second insulation layer, and positioned between two parts of the gate layer.

13. The device of claim 12, wherein the gate layer is exposed at two inner sides of the groove.

14. The device of claim 12, wherein the gate layer is made of a metallic material.

15. The device of claim 14, wherein the gate layer is made of tungsten.

16. The device of claim 12, wherein the fin structure comprises:
a plurality of gate layers and a plurality of second insulation layers stacked alternately over each other, with one of the gate layers at the bottom of the fin structure and one of the second insulation layers at the top of the fin structure, and wherein the channel layer covers the third insulation layer and the second insulation layer at the top of the fin structure.

17. The device of claim 12, wherein the channel layer is made of polysilicon, the first insulation layer is made of silicon dioxide, and the second insulation layer and the third insulation layer are both made of silicon nitride.

* * * * *